(12) United States Patent
Trottman

(10) Patent No.: US 10,001,861 B2
(45) Date of Patent: Jun. 19, 2018

(54) ELEVATOR WITH MAINTENANCE OPENING IN THE CAR FLOOR

(71) Applicant: Inventio AG, Hergiswil (CH)

(72) Inventor: Gilles Trottman, Immensee (CH)

(73) Assignee: INVENTIO AG, Hergiswil (CH)

(*) Notice: Subject to any disclaimer, the term of this patent is extended or adjusted under 35 U.S.C. 154(b) by 457 days.

(21) Appl. No.: 14/439,680

(22) PCT Filed: Oct. 24, 2013

(86) PCT No.: PCT/EP2013/072289
§ 371 (c)(1),
(2) Date: Apr. 30, 2015

(87) PCT Pub. No.: WO2014/067846
PCT Pub. Date: May 8, 2014

(65) Prior Publication Data
US 2015/0314991 A1    Nov. 5, 2015

(30) Foreign Application Priority Data

Oct. 30, 2012 (EP) .................................. 12190609

(51) Int. Cl.
| B66B 1/34 | (2006.01) |
| B66B 3/00 | (2006.01) |
| G06F 3/041 | (2006.01) |
| B66B 11/02 | (2006.01) |
| B66B 5/00 | (2006.01) |
| G06F 1/16 | (2006.01) |
| H03K 17/96 | (2006.01) |

(52) U.S. Cl.
CPC .......... *G06F 3/0414* (2013.01); *B66B 5/0087* (2013.01); *B66B 11/0246* (2013.01); *G06F 1/16* (2013.01); *G06F 3/0416* (2013.01); *H03K 17/964* (2013.01); *G06F 2203/04107* (2013.01)

(58) Field of Classification Search
CPC ........ G06F 3/0414; G06F 1/16; G06F 3/0416; G06F 2203/04107; B66B 5/0087; B66B 11/0246; H03K 17/964
USPC ........................................................ 187/393
See application file for complete search history.

(56) References Cited

U.S. PATENT DOCUMENTS 4,164,990 A    8/1979    Stiefel et al.

FOREIGN PATENT DOCUMENTS

| FR | 903318 A | 9/1945 |
| JP | 58020264 U | 2/1989 |
| JP | H03293278 A | 12/1991 |
| JP | H09202557 A | 8/1997 |
| JP | 2007015806 A | 1/2007 |
| WO | 0189977 A1 | 11/2001 |

*Primary Examiner* — Jeffrey Donels
(74) *Attorney, Agent, or Firm* — William J. Clemens; Shumaker, Loop & Kendrick, LLP

(57) ABSTRACT

An elevator includes a drive unit and an elevator car movable in an elevator shaft to a plurality of floors between a shaft ceiling and a shaft floor by the drive unit. The elevator car has a car floor which can be opened at least partially by at least one floor element to expose an opening. The elevator further includes a locking unit, with which the at least one floor element can be locked. The elevator also has an unlocking unit, by which the locking unit can be unlocked or released for unlocking only if the elevator car has reached an end position in the region of the lowermost floor.

11 Claims, 4 Drawing Sheets

Section A-A in FIG. 1

ELEVATOR WITH MAINTENANCE OPENING IN THE CAR FLOOR

FIELD

The invention relates to an elevator with an elevator car having a maintenance opening in the car floor.

BACKGROUND

An elevator car is usually moved in an elevator shaft between two end positions, namely a first, upper end position in the region of a shaft ceiling and a second, lower end position in the region of a shaft base. The regions below or above an elevator car are normally accessible to service personnel for maintenance work. In order to avoid accidents involving crushing, protective spaces of sufficient size, in which service personnel can safely stand at all times, have to be provided between the car floor and the shaft ceiling and between car floor and shaft base.

The arranging of such a protective space below the elevator car requires, for example, provision of a relatively deep shaft pit. This is contradictory to utilization of a given building volume as efficiently as possible. In the design of an elevator it is a question of realizing such a shaft pit in a space-saving manner. This problem was taken into account in patent specification WO 01/89977 A1.

WO 01/89977 A1 shows an elevator with an elevator car having a maintenance opening in the region of the car floor. Accordingly, the shaft pit is accessible by way of the maintenance opening for maintenance work. Since the maintenance opening remains open during the presence of service personnel in the shaft pit the protective space now extends from the shaft floor to the underside of the car roof. Consequently, an additional protective space does not have to be provided below the elevator car and the shaft pit depth can be designed to be minimal.

In an elevator car with a maintenance opening in the car floor region it is necessary to take into account special precautionary measures, since the maintenance opening may be opened only if it is possible to safely walk on the shaft base. This is guaranteed solely in the lower, end position of the elevator car. If the maintenance opening is opened in an upper position of the elevator car in the shaft a fall from the elevator car onto the shaft base is connected with substantial risk of injury.

SUMMARY

It is therefore the object of the present invention to design an elevator with an elevator car, which has a maintenance opening in the region of the car floor, to be as safe as possible.

The object is fulfilled by an elevator comprising a drive and an elevator car which is movable in an elevator shaft between shaft ceiling and shaft base to a plurality of building floors by means of the drive. In that case, the elevator car has a car floor which is openable at least partly by means of at least one floor element able to free an opening. In addition, the elevator comprises a locking unit by which the at least one floor element is lockable at the car floor. The elevator is distinguished by the fact that it has an unlocking unit by which the locking unit can be unlocked or released for unlocking only when the elevator car reaches an end position in the region of the lowermost floor.

It has proved advantageous here that the locking unit is lockable only in the region of the lowermost floor. A safer operation of the elevator, particularly in the case of work in the region of the shaft base due to maintenance, is ensured, because the opening in the car floor can be opened only in the end position, which is intended for that purpose, in the region of the lowermost floor so as to free access to the shaft base. Falling of a service engineer from the elevator car in the case of premature opening of the car floor is thus prevented.

By "floor element" there is to be understood here an element suitable for covering an opening in the car floor. The floor element or its connections with the car floor are to be so dimensioned that it can support an intended rated load or at least, in proportion to the entire area of the car floor, a part of the rated load of the elevator car. Usable as floor elements are, for example, panels, roller floors, sandwich plates, covered gratings and the like.

By "locking unit" there is to be understood here a unit which comprises at least one locking element such as, for example, a bolt, pin, peg or the like. The locking element can adopt a closed or open setting. In the closed setting the floor element is fixed relative to the car floor. Thereagainst, in the open setting the floor element is removable, pivotable, slidable or the like from the opening of the car floor. The locking unit preferably additionally comprises a locking mechanism by which the locking element can be brought into a closed or open setting or by which the locking element can be released for unlocking.

By "unlocking unit" there is to be understood here a unit which when the end position is reached by the elevator car the locking mechanism of the locking unit is set into motion or releases the locking mechanism for movement.

The unlocking unit is preferably so arranged in the lower region of the elevator shaft that when the elevator car is moved into the end position the unlocking unit comes into interaction with the locking unit. In that case, the locking unit can be unlocked or released for unlocking.

The interaction between the unlocking unit and the locking unit, which leads to unlocking of the locking unit, can be based on various technical principles.

In the case of a mechanical interaction the unlocking unit, for example, sets into motion a mechanism of the locking unit which displaces a pin, bolt or the like of the locking unit into an open position. In that regard, the movement energy of the elevator car is converted into movement of the mechanism.

Alternatively thereto, the mechanism is designed for the purpose of releasing a lock of the locking unit which can be actuated from the interior of the elevator car. In the released state the lock can be opened by a key, wherein a pin or a bolt is displaceable into an open position by the unlocking movement.

It will be obvious that the mechanism of the locking unit can comprise an electric motor which directly actuates the pin or bolt or releases it for opening. In that case, the mechanical interaction can, for example, be converted into movement of a switch.

The interaction which sets the above mechanism into motion can also be electrical, magnetic or electromagnetic in nature.

In the case of electrical interaction, an electrical contact, which supplies an electric motor of the locking unit with power, between the unlocking unit and the locking unit is, for example, closed. When the contact is closed, the electric motor drives the mechanism of the locking unit.

In the case of a magnetic interaction, the unlocking unit comprises, for example, a magnet and the locking unit comprises a Hall sensor, which detects the magnetic field generated by the magnet. An electronic evaluating system connected with the Hall sensor evaluates the signals of the Hall sensor and can, in the event of appropriate approach of the locking unit to the unlocking unit, activate an electric motor for actuation of the mechanism.

In the case of an electromagnetic interaction the unlocking unit comprises, for example, an RFID tag and the locking unit comprises an RFID reader. In the event of appropriate approach of the RFID tag to the RFID reader the RFID tag is supplied with current by means of inductive excitation and transmits a stored code to the RFID reader. An electronic evaluating system connected with the RFID reader evaluates the read-out code and in the case of a positive evaluation of the code activates an electric motor for actuation of the mechanism.

It is obviously open to the expert to realize further possibilities of interaction between the unlocking unit and locking unit to serve the purpose of unlocking the locking unit or releasing it for unlocking.

The unlocking unit preferably enters into mechanical interaction with the locking unit on movement of the elevator car into the end position. In that case, the locking unit can be unlocked or released for unlocking.

The movement of the elevator car into the end position is preferably detectable by means of a position detecting unit, which acts as unlocking unit. The locking unit is activatable on the basis of this positional detection. The locking unit can then be unlocked or released for unlocking.

In that case, it is advantageous to use already existing elevator components such as a shaft limit switch or shaft information system for activation of the locking unit. These elevator components then also take over the function of the unlocking unit.

Advantageously, the state of the at least one floor element can be monitored by means of a safety element, wherein operation of the elevator can be interrupted if the at least one floor element is in an open state.

In that regard it is advantageous that safer operation of the elevator is guaranteed. In particular, in the case of open floor elements the elevator car cannot be moved to a higher position in the elevator shaft. The floor element is thus removable only in the lowermost position. Accordingly, it is made impossible for a service engineer to fall during opening of the floor element.

The safety element, which is a component of a safety system, is usually designed as a contact or switch. The safety system can comprise a safety chain of serially connected contacts and/or switches. When the safety chain is closed the drive unit of the elevator is supplied with energy. When the contact or switch is open the safety chain is interrupted. In that case, the energy feed to a drive unit is interrupted or operation of the lift elevator is interrupted.

Alternatively, the safety system can comprise a safety bus and a safety controller. At least one contact and/or switch is or are connected with the safety bus by way of a bus junction. The safety controller interrogates the state of the at least one contact and/or switch by way of the safety bus. If the safety controller detects an unsafe state of a contact and/or switch the safety controller transmits a stop signal to the drive unit or interrupts the energy feed to the drive unit. The operation of the elevator is in that event interrupted.

Advantageously, the position of the elevator car in the end position can be monitored by means of the position detecting unit, wherein unintended car travel with an opening remaining open can be detected by means of the position detecting unit and accordingly a brake can be activated in order to stop the unintended car travel.

In that regard it is of advantage that in the case of maintenance work in the shaft pit with the floor element open the elevator car can be climbed into again. In particular, the elevator car is prevented from moving to a higher position in which climbing into the elevator car is impossible.

The brake is designed as, for example, a drive brake and acts directly on the drive, particularly on its drive shaft. When the drive brake is activated an undesired rotational movement of the drive can be prevented. Alternatively thereto the brake can be designed as a car brake, wherein the brake is fastened to the elevator car and acts on guide rails of the elevator car. When the car brake is activated the elevator car is fixed to the guide rails. Unintended movement of the elevator car is thus prevented.

Advantageously, the elevator can be brought back into operation by means of a control unit and in that case brought into a maintenance mode.

In the maintenance mode travels of the elevator car are possible to a restricted extent. Thus, the elevator car can be moved to a higher position in order to reach components which are to be maintained and to which access is otherwise difficult, such as, for example, laterally disposed buffers or guide rails. In addition, components arranged in the lower region of the elevator car such as, for example, a safety brake or a suspension point of the elevator car can similarly be reached more easily.

The control unit can comprise a switch panel with control elements. The control unit is connected with an elevator control of the elevator. The control unit can already be previously connected with the elevator control and can be mounted in the region of the elevator car below a cover. In this embodiment the control unit is arranged at the elevator car by way of a cable, wherein the cable is at least of such length that a maintenance engineer can control the lift elevator from the shaft base by way of the control unit. Alternatively, the control unit can be designed as mobile apparatus which is connectible with the elevator control by way of an interface in the elevator car or by way of a cable-free network.

At least the safety element of the floor element can be reset by way of the control unit. In addition, control commands can, in the maintenance mode, be sent to the elevator control by way of the control unit.

Advantageously, the elevator car is movable, controlled by means of the control unit, from the end position to a maintenance position, wherein the maintenance position is arranged above the end position.

The maintenance position is a position in which the elevator components, which are to be maintained, in the region of the shaft base can be reached as satisfactorily as possible and ergonomic and efficient work by the maintenance engineer is possible.

With advantage, the position of the elevator car in the maintenance position can be monitored by means of the position detecting unit, wherein an unintended car travel with an opening which is open can be detected by means of the position detecting unit and accordingly a brake can be activated in order to stop the unintended car travel.

Analogously to the end position, the maintenance position of the elevator car can also be monitored. In that regard, travels of the car both into the work region and out of the work region can be prevented. It is thus ensured that not only is a maintenance engineer not unintentionally crushed between the car and shaft base, but also a control unit connected with the elevator does not depart from the operating range of the maintenance engineer.

The opening advantageously has a dimension of at least 50 to 60 centimeters.

It is thus ensured that a maintenance engineer can safety and comfortably climb out of the opening of the elevator car onto the shaft base and back again into the elevator car.

Advantageously the position of the opening at the car floor can be indicated on the shaft base by way of indicating means.

This facilitates recognition of a safe work region for the maintenance engineer on the shaft floor, particularly in the case of travel of the elevator car from the maintenance position to the end position. During this travel in the maintenance mode, the maintenance engineer can quickly enter this safe and easily recognizable work region.

Suitable as indicating means is, for example, a profile, which is applied to the shaft base by means of paint, adhesive tape, adhesive film or the like, of the opening in the car floor. Obviously, a light source can also serve as indicating means, by which light source the safe work region can be projected onto the shaft base. Instead of the profile, the standing area of the opening or the area lying outside the opening can also be visually characterized.

DESCRIPTION OF THE DRAWINGS

The principle is shown in the drawings and is explained in the following by way of the drawings, in which.

DETAILED DESCRIPTION

Figure 1:
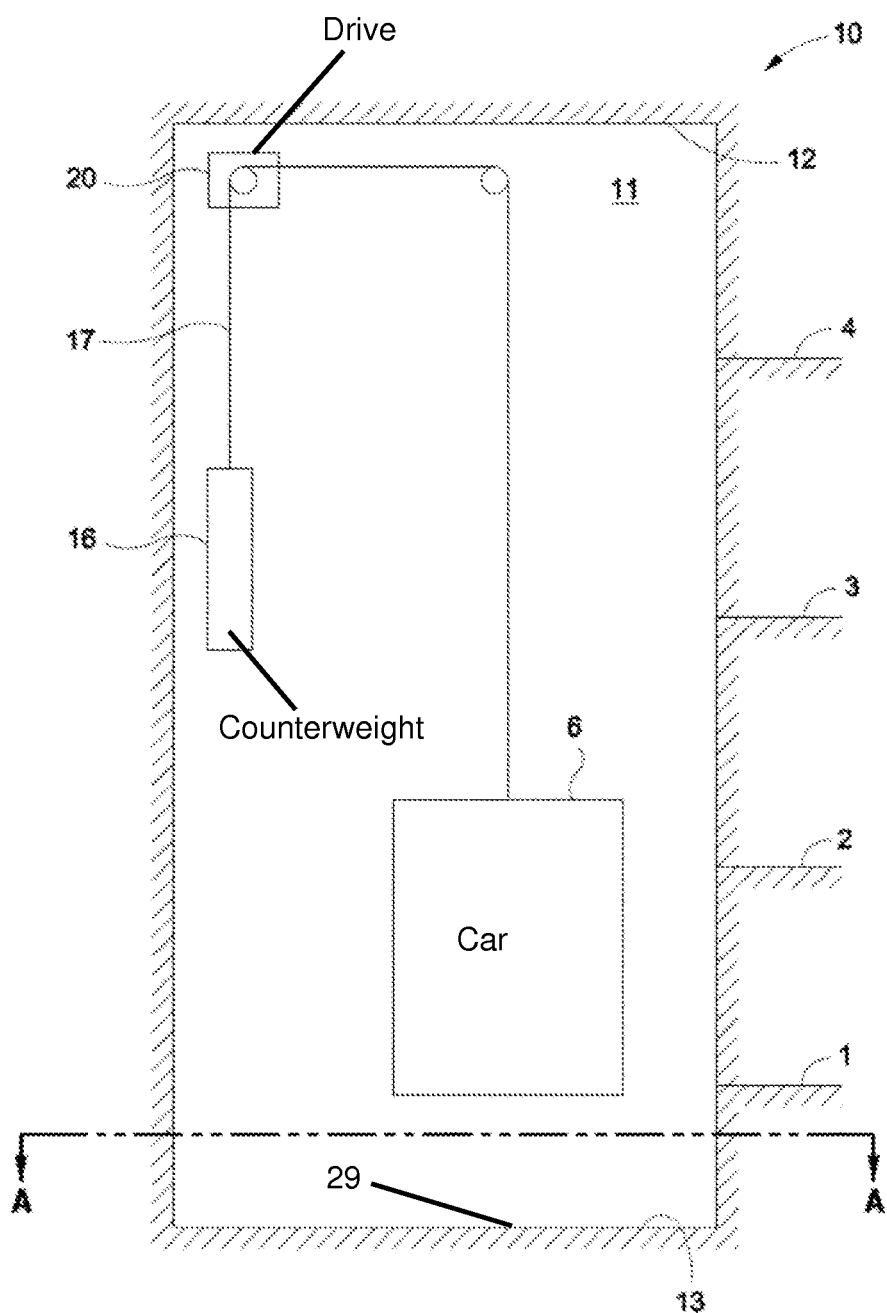
FIG. 1 shows an elevator with four access planes.

FIG. 1 shows an elevator 10 which comprises an elevator car 6 and a drive 20. The elevator car 6 is moved along a travel path to several floors 1 to 4 by means of the drive 20. The travel path is here accommodated in an elevator shaft 11 bounded by four side walls, a shaft ceiling 12 and a shaft base 13. The car 6 is usually guided at car guide rails which are not shown in FIG. 1.

The drive power of the drive 20 is transmitted to a support means 17 by a drive pulley operatively connected with the drive 20. The elevator car 6 is suspended at an end of the support means 17. In order to provide compensation for the weight of the elevator car 6 a counterweight 16, which is suspended at a second end of the support means 11, is provided. Obviously, apart from the depicted 1:1 suspension of the elevator car 6 and the counterweight 16 also possible solutions which differ therefrom and in which suspension ratios of 2:1 and more are selected will be evident to the expert. Moreover, the elevator can also be realized without a counterweight. Cables, belts and the like are suitable as support means 17.

Figure 2:
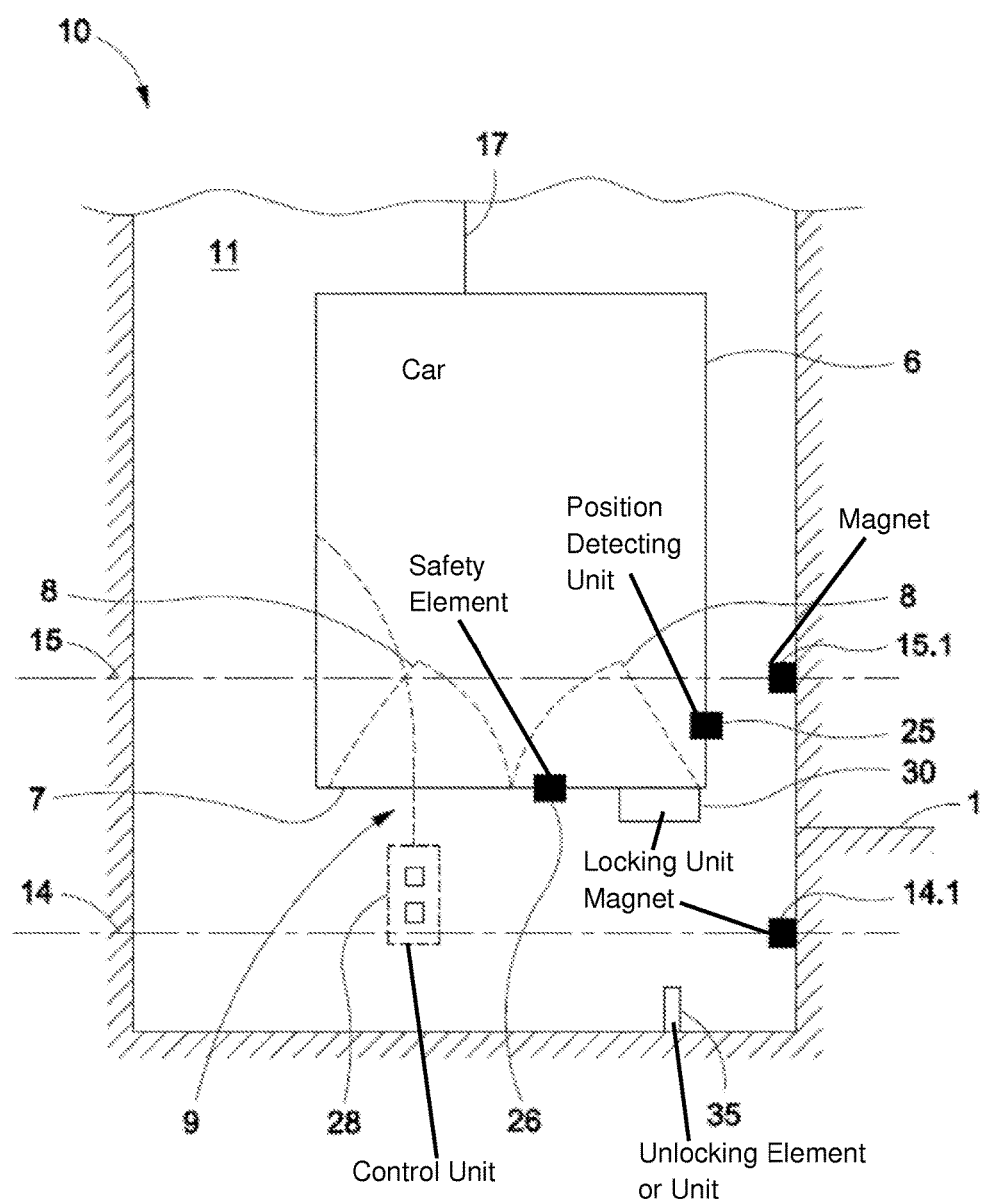
FIG. 2 shows this elevator with an elevator car which has at the car floor a maintenance opening lockable by means of a mechanically activatable locking unit.

FIG. 2 illustrates a first embodiment of the elevator 10. The elevator car 6 has two floor elements 8 which are fastened as leaf panels to the car floor 7 by hinging. In a horizontal position of the floor elements 8 an opening 9 in the car floor 7 is covered. The two floor elements 8 can be pivoted into a vertical position in which the floor elements 8 free the opening 9.

Moreover, a locking unit 30 is arranged at the elevator car 6 in the region of the car floor 7. The floor elements 8 can be locked by means of this locking unit 30 at the car floor 7. For that purpose the locking unit 30 comprises at least a locking element such as, for example, a bolt, which in its closed state locks a pivotable region of the floor elements 8 to the car floor 7.

The elevator car 6 stops, in accordance with FIG. 1, in the region of the lowermost floor 1 and is on the point of reaching an end position 14. In this end position 14 the locking unit 30 is unlockable by an unlocking element 35 or releasable for unlocking. The unlocking unit 35 is for that purpose so arranged on the shaft base 13 that in the end position 14 of the elevator car 6 the unlocking unit 35 interacts with the locking unit 30, by which the locking unit 30 is for the first time unlocked or releasable for unlocking.

In the illustrated embodiment according to FIG. 1 the unlocking unit 35 is designed as a peg, tube, plug or the like which protrudes vertically from the shaft base 13 into the interior of the elevator shaft 11 and comes into mechanical interaction with the locking unit 30. In that case, the peg 35 is guided into an insert opening of the locking unit 30 and sets a mechanism of the locking unit 30 into motion. The mechanism either sets the bolt directly into its open setting or releases the bolt for later manual actuation.

A service engineer standing in the elevator car 6 can now, on automatic opening of the bolt, pivot up the floor elements 8 in the interior of the elevator car 6 and free the opening 9 in the car floor 7. Alternatively, the service engineer has to manually actuate beforehand the bolt released for unlocking. For that purpose the maintenance engineer introduces a triangular key into an opening freed by the locking unit 30 and brings the bolt into an open setting by means of rotational movement of the triangular key and corresponding actuation of a lock mechanism. Release of the lock mechanism of the bolt can also be effected by the locking unit 30 by way of uninhibiting of the lock mechanism. In that case, the opening for introduction of the triangular key into the lock mechanism can be open even when the locking element 30 is not activated.

A safety element 26 for ensuring safe operation of the elevator 10 when the car floor 7 is open is provided at the elevator car 6. The safety element 26 monitors the opening state of the floor elements 8. The safety element 26 can in that case be designed as an electromechanical switch or contact. When the floor elements 8 are swung open the safety element 26 is opened. The safety element 26 is a part of a safety system which when the safety element 26 is opened interrupts operation of the elevator 10. The safety system is not shown in FIG. 2.

The safety system can be designed as a classic safety chain in which the safety element 26 is one of a plurality of safety elements connected in series. When the safety element 26 is opened the safety chain is interrupted and thus prevents power feed to the drive 20 and an associated holding brake. This causes interruption of operation of the elevator 10, during which the maintenance engineer can safely leave the elevator car 6 from the opening 9 in the car floor 7.

Alternatively thereto the safety system can comprise a safety controller and a safety bus. The safety element 26 is connected with the safety bus by way of a bus junction. The safety controller periodically interrogates the status of the safety system 26 and in the event of detection of an opened safety element 26 takes the drive 20 out of operation and activates the associated holding brake.

In addition, the position of the elevator car 6 in the end position 14 is monitored by means of a position detecting unit 25. The position detecting unit 25 is preferably arranged at the elevator car 6 and comprises a sensor, for example a Hall sensor, which is suitable for the purpose of detecting the position of a magnet 14.1 so arranged in the region of the elevator shaft 11 that this indicates the end position 14.

If the elevator car 6, with the opening 9 open, moves out of the region of the end position 14 the position detecting unit 25 detects this and activates a car brake.

In addition, the elevator 10 comprises a control unit 28, which is preferably connected with the elevator car 6 by way of a signal transmission cable. The cable connects, for example, the control unit 28 with a car control panel at which destination floors can be input. By way of this car control panel the control unit 28 is also connected with an elevator control. The control unit 28 can be fixedly connected with the car control panel and mounted behind a cover in the elevator car 6.

Alternatively thereto the control unit 28 can be carried by the service engineer and, for example, connected with the car control panel by way of an interface.

The signal transmission cable is preferably of such length that the control unit 28, when the car floor 7 is open, hangs below the elevator car 6 as far as the work region of the maintenance engineer.

The control unit 28 can obviously also be connected with the elevator control by way of a cable-free network.

The elevator 10 can be brought by way of the control unit 28 into a maintenance mode in which the elevator car 6 is movable at least into a maintenance position 15 lying above the end position 14.

This maintenance position 15 can optionally be monitored by means of the position detecting unit 25.

For this purpose, a further magnet 15.1 is so arranged in the elevator shaft 11 that the further magnet indicates the maintenance position 15. If the elevator car 6 in the case of travel to the maintenance position 15, or in the case of unintended travel thereafter with the opening 9 open, travels beyond the maintenance position 15 this is detected by the position detecting unit 25, which takes the elevator 10 out of operation in that the drive 20 is turned off and the associated holding brake activated. It is thus ensured that the elevator car 6 does not move into a region of the elevator shaft 11 unreachable by the service engineer.

In addition, the position detecting unit 25 can monitor the position of the elevator car 6 after reaching the maintenance position 15 and prevent an undesired downward travel of the elevator car 6 from the maintenance position 15.

Figure 3:
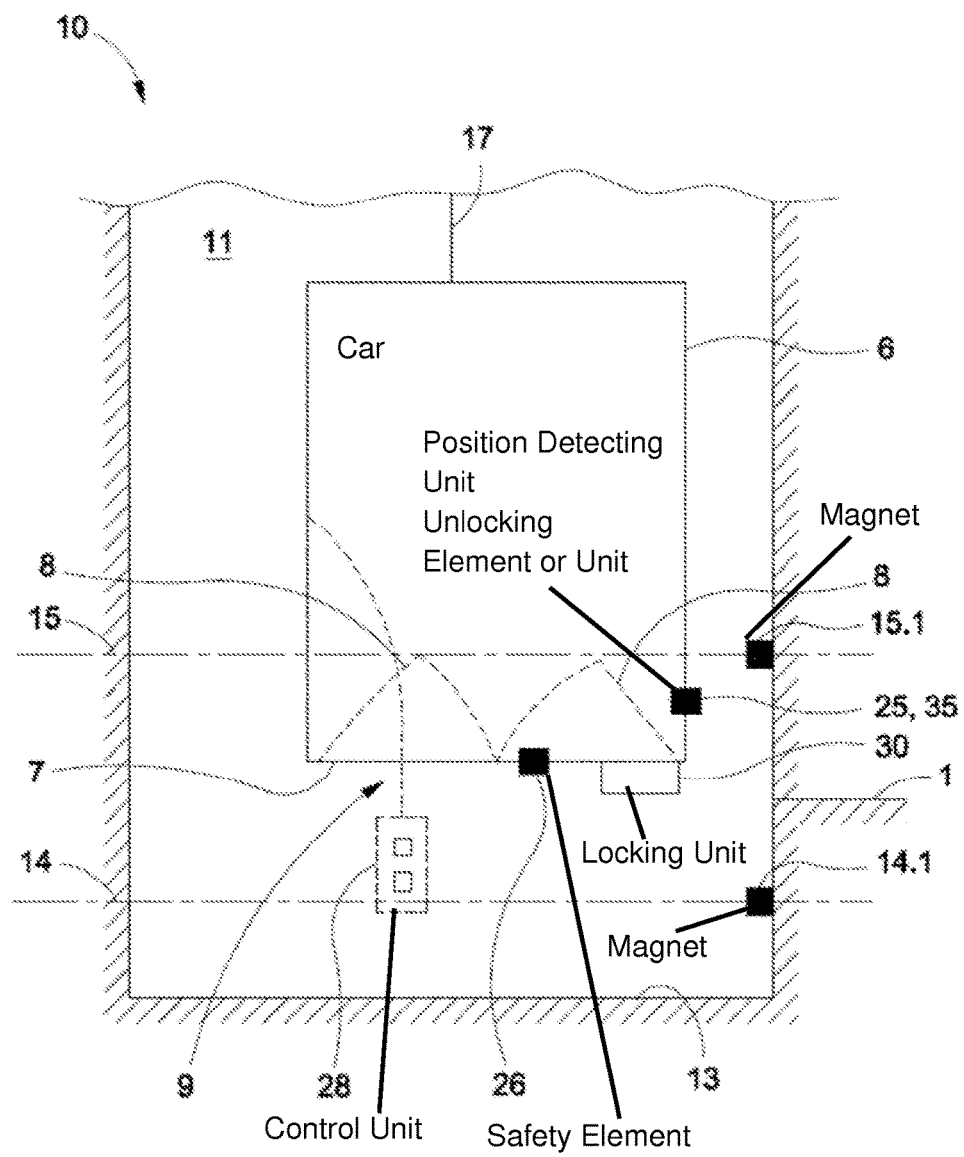
FIG. 3 shows this elevator with an elevator car which has at the car floor a maintenance opening lockable by means of a magnetically activatable locking unit.

A second embodiment is illustrated in FIG. 3. In that, the locking unit 30 is unlockable by the position detecting unit 25 or releasable for unlocking as soon as the position detecting unit 25 has detected the end position 14. The position detecting unit 25 in that regard takes over the function of the unlocking unit 35 from the first embodiment.

The locking unit 30 according to FIG. 3 comprises a motor which sets a mechanism into motion. As a consequence of the detected end position 14 the position detecting unit 25 transmits a signal to the motor in order to set the mechanism in motion and thus bring the bolt directly into an open state or release the bolt for later manual actuation. Opening of the car floor 7 takes place analogously to the first embodiment. Monitoring of the open state of the floor elements 8 by means of the safety element 26, monitoring of the end position 14 and maintenance position 15 by means of the position detecting unit 25 and control of the elevator by means of the control unit 28 can also be realized in the second embodiment.

Figure 4:
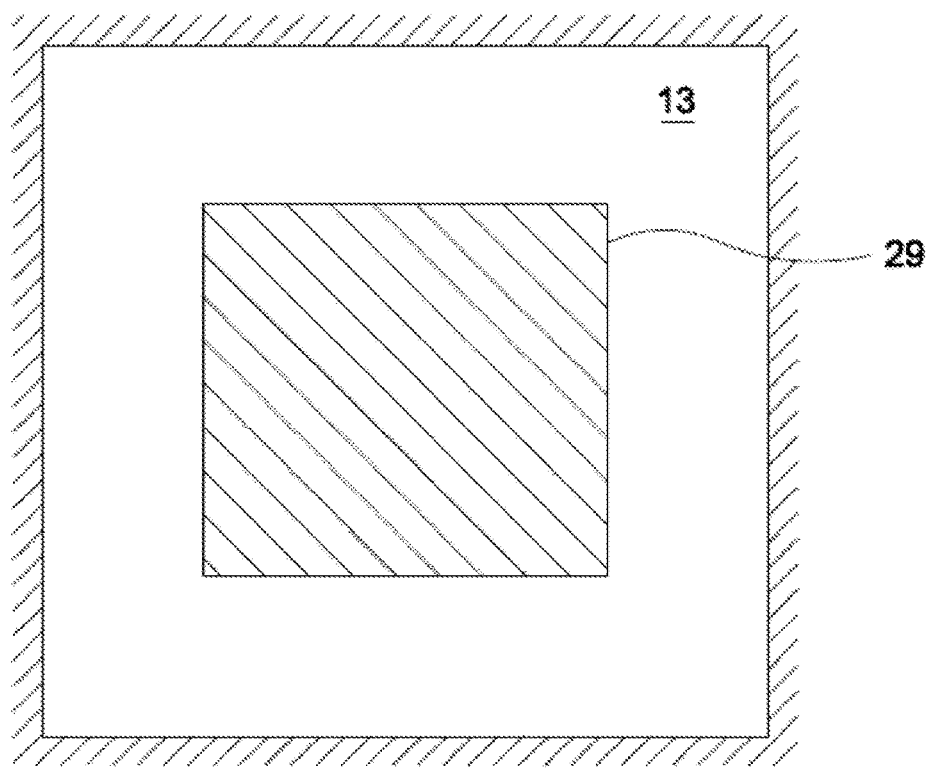
FIG. 4 is a sectional view taken along the line A-A in FIG. 1 and shows this elevator with indicating means which indicate, on the shaft base, the maintenance opening at the car floor.

FIG. 4 shows indicating means 29 by which the position of the opening 9 at the car floor 7 is indicated on the shaft base 13. Serving as indicating means 29 are, for example, adhesive tapes which visualize a footprint, which is projected vertically downwards, of the opening 9 at the shaft base 13. This footprint can obviously also be indicated by means of applied paint, adhesive films or light, which is projected from a light source, on the shaft base 13.

In accordance with the provisions of the patent statutes, the present invention has been described in what is considered to represent its preferred embodiment. However, it should be noted that the invention can be practiced otherwise than as specifically illustrated and described without departing from its spirit or scope.

The invention claimed is:

1. An elevator with a drive, an elevator car movable by the drive in an elevator shaft between a shaft ceiling and a shaft base to a plurality of floors, wherein the elevator car has a car floor which is openable at least partly by at least one floor element to free an opening in the car floor, and a locking unit by which the at least one floor element is lockable at the cage floor, comprising:
an unlocking unit positioned in the elevator shaft for unlocking or releasing for unlocking the locking unit only when the elevator car has reached an end position in a region of a lowermost one of the floors.

2. The elevator according to claim 1 wherein the unlocking unit is arranged in the lower region of the elevator shaft so that when the elevator car is moved into the end position the unlocking unit enters into an interaction with the locking unit and the locking unit is unlocked or released for unlocking.

3. The elevator according to claim 2 wherein when the elevator car is moved into the end position the unlocking unit enters into a mechanical interaction with the locking unit and the locking unit is unlocked or released for unlocking.

4. The elevator according to claim 2 wherein the movement of the elevator car into the end position is detected by a position detecting unit, which position detecting unit operates as the unlocking unit and the locking unit is unlocked or released for unlocking in response to the positional detection.

5. The elevator according to claim 1 wherein a position of the at least one floor element is monitored by a safety element, whereby in an open position of the at least one floor element operation of the elevator can be interrupted.

6. The elevator according to claim 1 wherein a position of the elevator car in the end position is monitored by a position detecting unit, wherein unintended car travel when the opening is open is detectable by the position detecting unit for stopping the unintended car travel.

7. The elevator according to claim 1 wherein in an open position of the at least one floor element operation of the elevator is interrupted and including a control unit for operating the elevator in a maintenance mode.

8. The elevator according to claim 7 wherein the elevator car is movable under control of the control unit from the end position to a maintenance position, wherein the maintenance position is above the end position in the elevator shaft.

9. The elevator according to claim 8 wherein a position of the elevator car in the maintenance position is monitored by a position detecting unit, wherein unintended car travel when the opening is detectable by the position detecting unit for interrupting operation of the elevator.

10. The elevator according to claim 1 wherein the opening has a dimension of at least 50 to 60 centimeters.

11. The elevator according to claim 1 including an indicator on the shaft base visually indicating to a person a work region corresponding to a position of the opening in the car floor.

\* \* \* \* \*